(12) United States Patent
Tseng et al.

(10) Patent No.: US 8,664,723 B1
(45) Date of Patent: Mar. 4, 2014

(54) INTEGRATED CIRCUIT STRUCTURES HAVING BASE RESISTANCE TUNING REGIONS AND METHODS FOR FORMING THE SAME

(71) Applicant: Taiwan Semiconductor Manufacturing Company, Ltd., Hsin-Chu (TW)

(72) Inventors: Jen-Chou Tseng, Jhudong Township (TW); Wun-Jie Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/723,993

(22) Filed: Dec. 21, 2012

Related U.S. Application Data

(60) Provisional application No. 61/720,709, filed on Oct. 31, 2012.

(51) Int. Cl.
*H01L 23/62* (2006.01)
(52) U.S. Cl.
USPC ........... 257/355; 257/495; 257/510; 438/298; 438/223

(58) Field of Classification Search
USPC .................. 257/355, 495, 510; 438/298, 223
See application file for complete search history.

(56) References Cited

U.S. PATENT DOCUMENTS

| 5,559,352 | A | 9/1996 | Hsue et al. | |
| 7,786,507 | B2 * | 8/2010 | Denison et al. | 257/173 |

* cited by examiner

*Primary Examiner* — Tu-Tu Ho
(74) *Attorney, Agent, or Firm* — Slater & Matsil, L.L.P.

(57) ABSTRACT

A structure includes an isolation ring at a top surface of a substrate. A well region of a first conductivity type is in a surface portion of the substrate. The well region includes a first portion having a top portion encircled by the isolation ring, and a second portion having a top portion encircling the isolation ring. A base resistance tuning ring includes a portion overlapped by the isolation ring, wherein the base resistance tuning ring is between the first portion and the second portion of the well region. The base resistance tuning ring is selected from the group consisting essentially of a ring of the first conductivity type, a substantially neutral ring, and a ring of a second conductivity type opposite the first conductivity type.

20 Claims, 12 Drawing Sheets

INTEGRATED CIRCUIT STRUCTURES HAVING BASE RESISTANCE TUNING REGIONS AND METHODS FOR FORMING THE SAME

This application claims the benefit of the following provisionally filed U.S. patent application: Application Ser. No. 61/720,709, filed Oct. 31, 2012, and entitled "Integrated Circuit Structures Having Base Resistance Tuning Regions and Methods for Forming the Same;" which application is hereby incorporated herein by reference.

BACKGROUND

It is well known that extremely high voltages can develop in the vicinity of an integrated circuit due to the build-up of static charges. A high potential may be generated to an input or output buffer of an integrated circuit, which may be caused by a person touching a package pin that is electrically connected to the input or output buffer. When the electrostatic charges are discharged, a high current is produced at the input and output nodes of the integrated circuit. Electrostatic discharge (ESD) is a serious problem for semiconductor devices since it has the potential of destroying the entire integrated circuit.

The duration of the ESD transient is very short, typically in the order of nanoseconds, and the conventional circuit breakers cannot react quickly enough to provide adequate protection. For this reason, it has become a known practice to incorporate ESD devices in integrated circuits, and/or to add features to improve the self-protection ability of integrated circuit devices against ESD.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

An integrated circuit structure with improved Electrostatic discharge (ESD) prevention ability and the method of forming the same are provided in accordance with various exemplary embodiments. The intermediate stages of forming the integrated circuit structure are illustrated. The variations of the embodiments are discussed. Throughout the various views and illustrative embodiments, like reference numbers are used to designate like elements.

Figure 1:
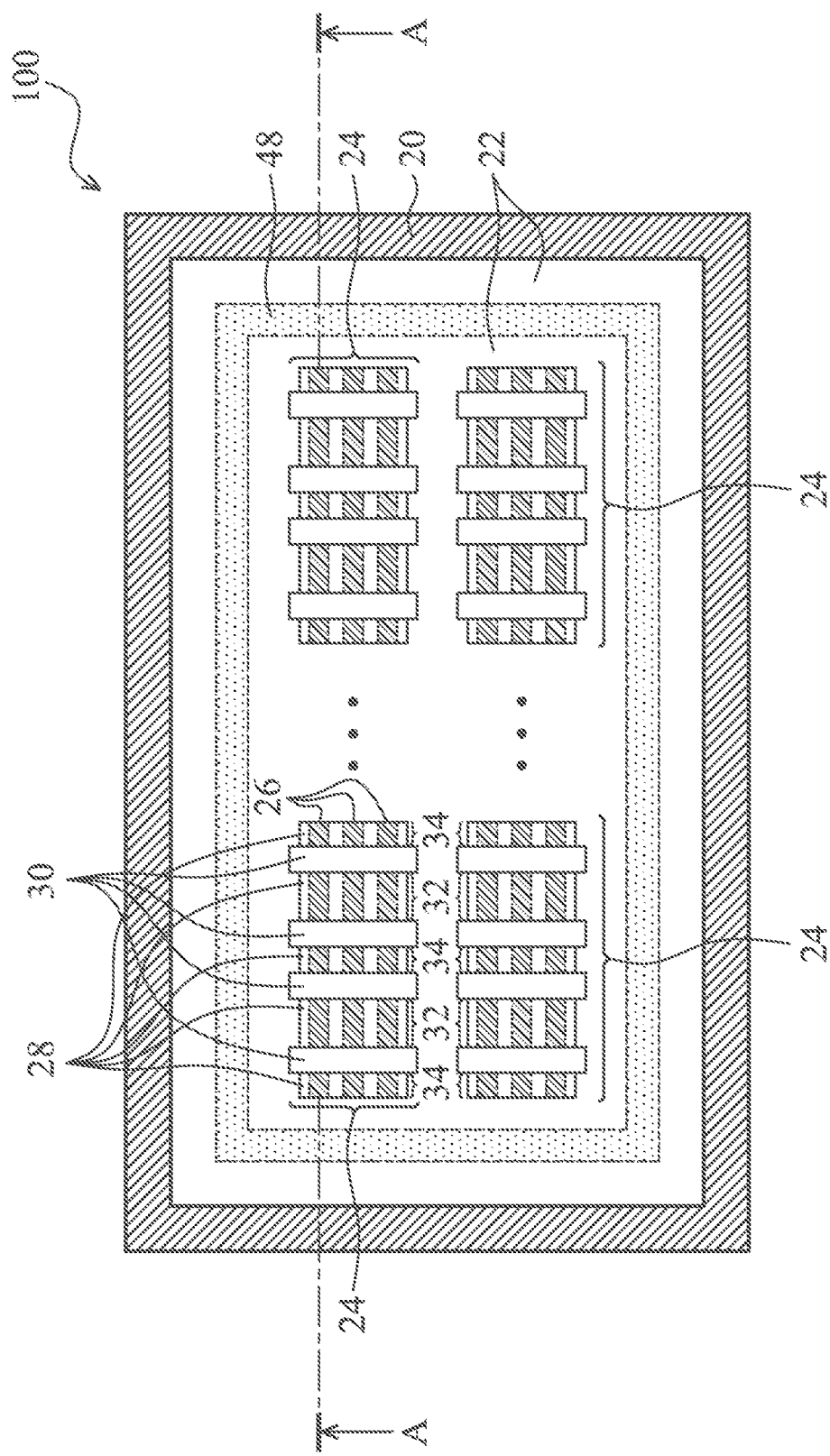
FIG. 1 illustrates a top view of an integrated circuit structure in accordance with some exemplary embodiments, wherein a base resistance tuning region encircles integrated circuit devices.

FIG. 1 illustrates a top view of integrated circuit structure 100, which includes well pickup region 20 forming a ring encircling isolation regions 22. Well pickup region 20 may be a heavily doped p-type region in accordance with some embodiments. Isolation regions 22 may be Shallow Trench Isolation (STI) regions, field oxides, or the like. Active devices 24 are formed in the region encircled by well pickup region 20, and the active regions of active devices 24 may be defined by isolation regions 22. In some embodiments, active devices 24 are Metal-Oxide-Semiconductor (MOS) devices, which may be planar transistors or Fin Field-Effect Transistors (FinFETs). The MOS devices may also be high-voltage MOS devices such as Lateral Diffused MOS (LDMOS) devices. Active devices 24 may also be Field Oxide Devices (FODs), Silicon-Controlled Rectifiers (SCRs), or the like. Base resistance tuning ring 48 is formed to encircle devices 24.

Active devices 24 are illustrated as FinFETs in accordance with exemplary embodiments, wherein FinFETs 24 include semiconductor fins 26 separated from each other by isolation regions 22. Gate electrodes 30 cross over semiconductor fins 26 to form FinFET 24. In some embodiments, epitaxy regions 28 are grown from fins 26 (or from the recesses formed by etching source and drain portions of fins 26), and are used to form drain regions 32 and source regions 34. It is appreciated that the illustrative devices 24 are merely examples, and the concept of the present disclosure may be applied to other types of devices such as planar MOS devices, FODs, SCRs, or the like.

Figure 2:
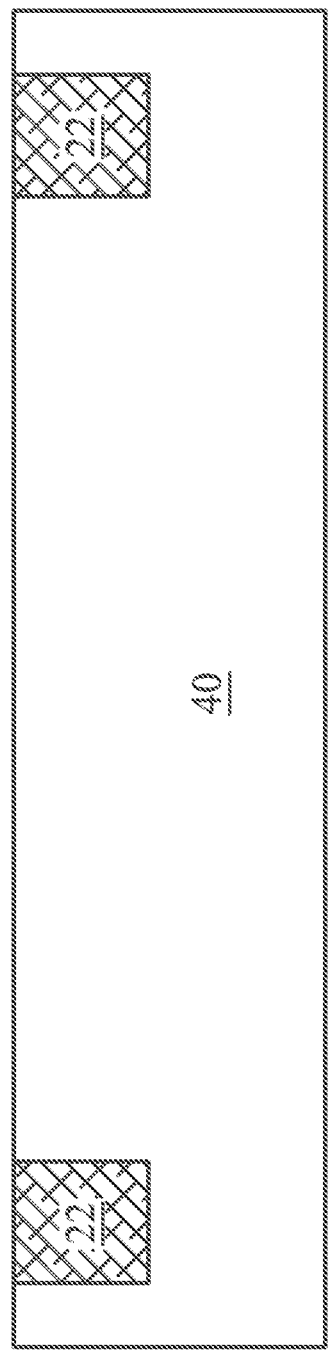
FIGS. 2 through 6 are cross-sectional views of intermediate stages in the manufacturing of the integrated circuit structure in FIG. 1 in accordance with some exemplary embodiments, wherein the base resistance tuning region is coupled between a well pickup region and the respective well region.

FIGS. 2 through 6 are cross-sectional views of intermediate stages in the manufacturing of an integrated circuit structure in accordance with exemplary embodiments. The cross-sectional views are obtained from the plane crossing line A-A in FIG. 1. For clarity, throughout all cross-sectional views, one device 24 is illustrated, although a plurality of devices 24 may be in a cross-sectional view. The manufacturing steps are discussed referring the flow chart shown in FIG. 12. Referring to FIG. 2, substrate 40 is provided, wherein substrate 40 may be a portion of a semiconductor wafer such as a silicon wafer. Alternatively, substrate 40 may include other semiconductor materials such as germanium. Substrate 40 may also include a compound semiconductor such as silicon carbon, gallium arsenic, indium arsenide, indium phosphide, III-V compound semiconductor materials, or the like. Substrate 40 may be a bulk semiconductor substrate, or may have a Semiconductor-On-Insulator (SOI) structure. Substrate 40 may be lightly doped with a p-type impurity, and may have a concentration between about $10^{14}/cm^3$ and about $10^{16}/cm^3$.

Insulation regions 22 are formed (step 102 in FIG. 12) in substrate 40 to define and electrically isolate active regions, in which devices such as transistors are to be formed. Insulation regions 22 may be Shallow Trench Isolation (STI) regions or Local Oxidation of Silicon (LOCOS) regions. Although insulation regions 22 are illustrated as discrete regions, the illustrated insulation regions 22 may be portions of a ring (FIG. 1). Accordingly, insulation regions 22 are referred to as isolation ring 22 hereinafter.

Figure 3:
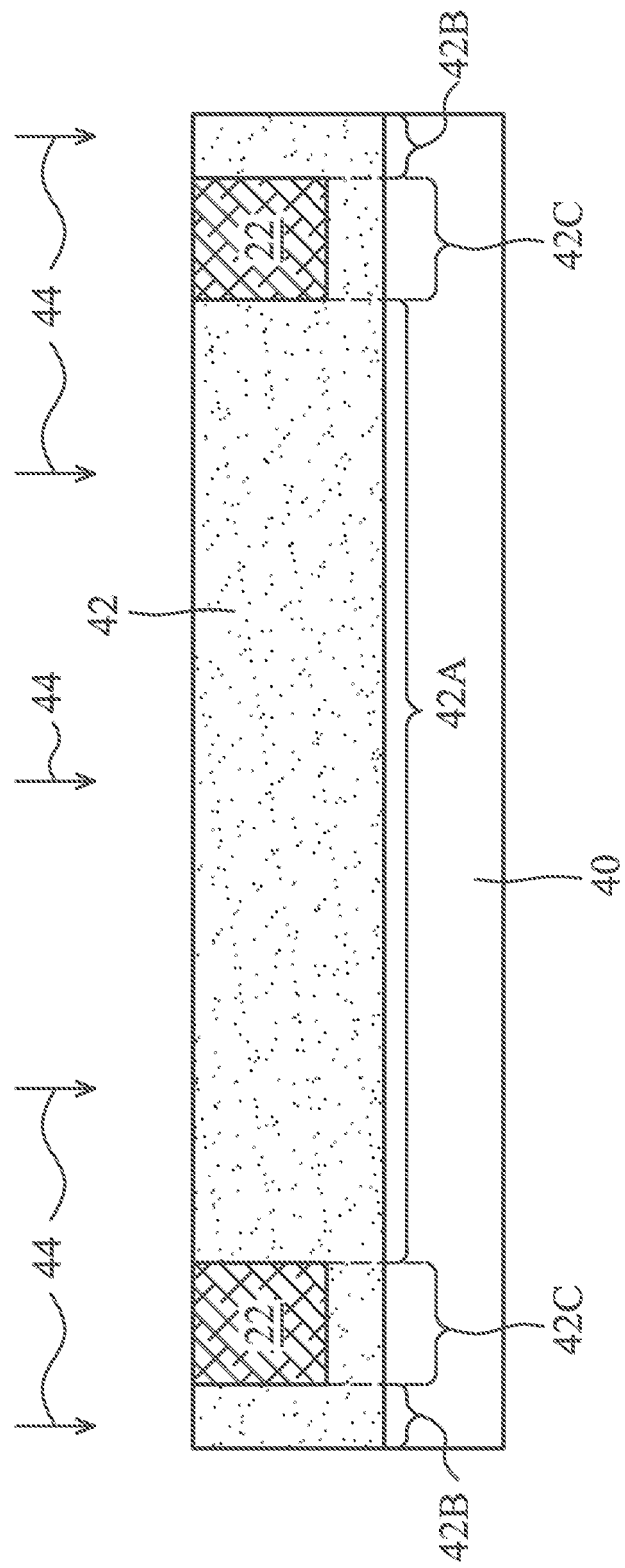
Figure 12:
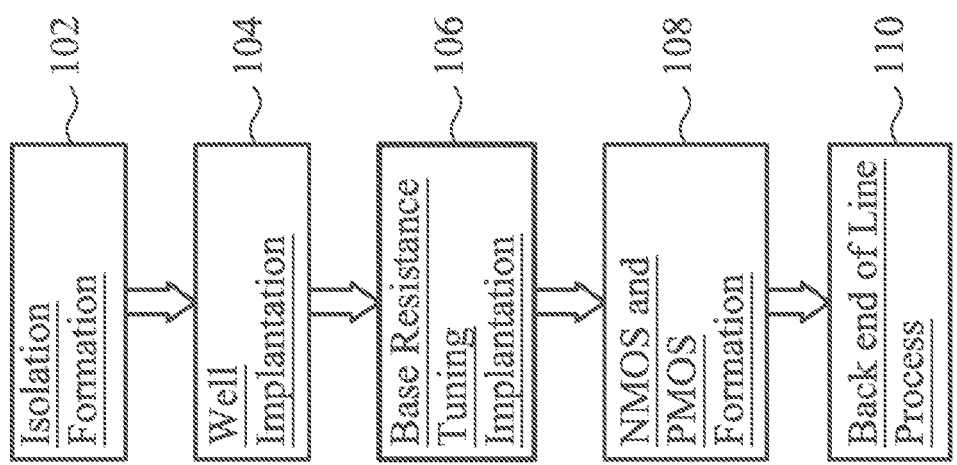
FIG. 12 illustrates a flow chart for forming the integrated circuit structure in accordance with embodiments, wherein the flow chart corresponds to the processes shown in FIGS. 1 through 11.

FIG. 3 illustrates the formation of p-well region 42 (step 104 in FIG. 12). In some embodiments, the formation of p-well region 42 includes forming and patterning a photo resist (not shown since it is outside the illustrated region), wherein a portion of substrate 40 is exposed through the photo resist. An implantation (represented by arrows 44) is then performed to form p-well region 42. The respective photo resist is then removed. In some exemplary embodiments, p-well region 42 has an impurity concentration between about $10^{14}/cm^3$ and about $10^{17}/cm^3$. It is appreciated, however, that the values recited throughout the description are merely examples, and may be changed to different values.

P-well region 42 comprises portion 42A encircled by isolation ring 22. Furthermore, p-well region 42 includes portions 42B outside the isolation region ring 22, which portions 42B may also form a ring encircle isolation ring 22. P-well region 42 may further include portions 42C extending below isolation ring 22, which portions 42C may form a ring, and hence are referred to as well ring 42C hereinafter. P-well ring 42C is between, and interconnects, p-well portions 42A and 42B.

Figure 4:
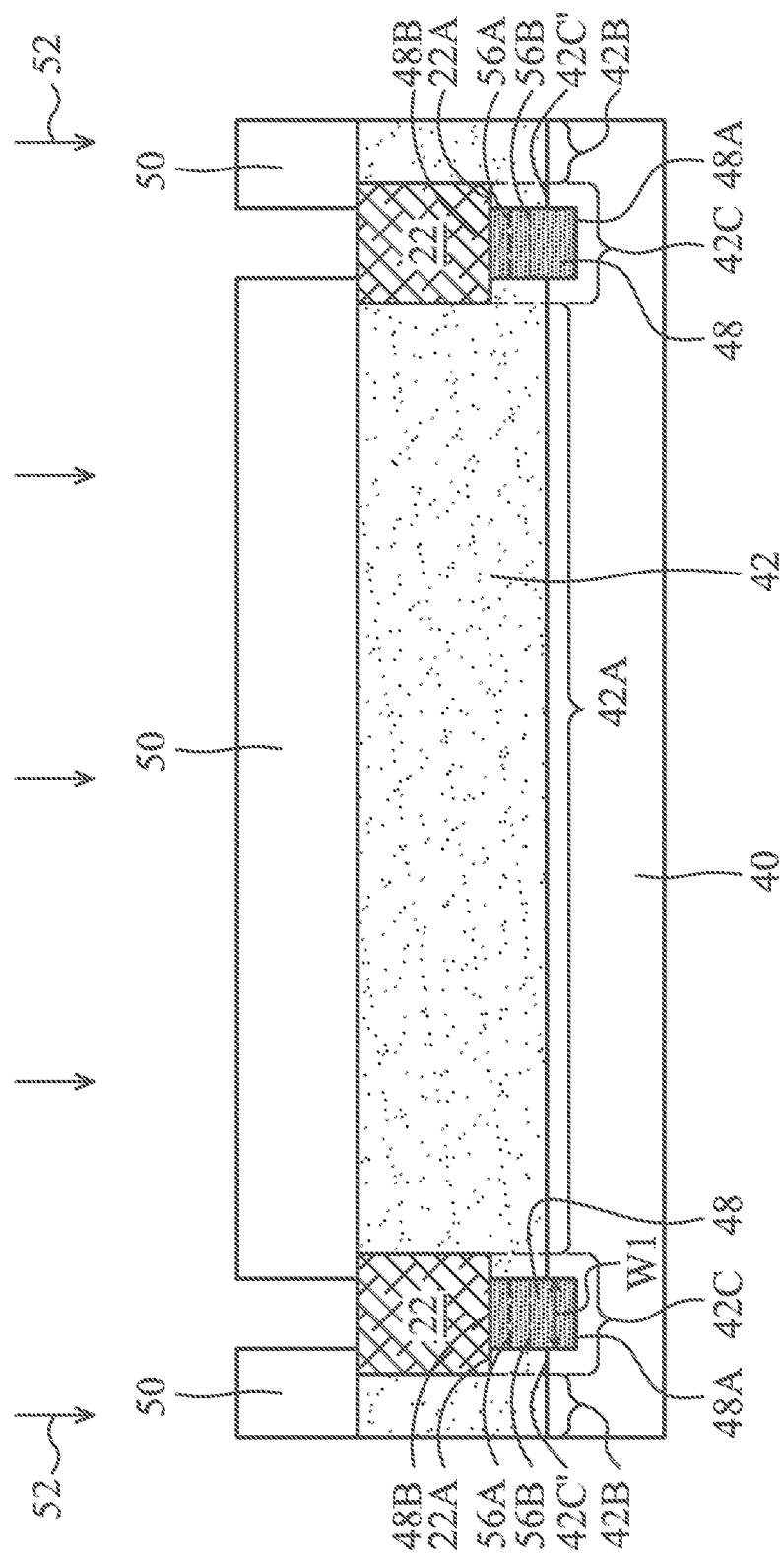

Referring to FIG. 4, a counter-doping (represented by arrows 52) is performed to form base resistance tuning region(s) 48 (step 106 in FIG. 12), which may form a ring, and hence are referred to as base resistance tuning ring 48 hereinafter. The counter-doping results in the resistance between p-well portions 42A and 42B to be increased, and hence the ESD prevention ability of the resulting devices 24 (FIG. 1) is improved, as will be discussed in detail in subsequent paragraphs. To perform the implantation, photo resist 50 is formed and patterned, and portions of isolation regions 22 are exposed. An n-type impurity such as phosphorous, indium, or combinations thereof is then implanted into p-well ring 42C to form base resistance tuning ring 48. The n-type impurity concentration of the implanted n-type impurity may be between about $10^{14}/cm^3$ and about $10^{16}/cm^3$.

In some embodiments, the doping concentration of the implanted n-type impurity is greater than the p-type doping concentration in p-well ring 42C. In which embodiments, the n-type impurity concentration of the implanted n-type impurity may be greater than about $10^{16}/cm^3$. Accordingly, base resistance tuning ring 48 is converted from the original p-type to n-type. In these embodiments, the net impurity concentration in base resistance tuning ring 48 is n-type, wherein the net impurity concentration may be lower than about $10^{17}/cm^3$. The resulting base resistance tuning ring 48 is an n-type region. In alternative embodiments, the doping concentration of the implanted n-type impurity is substantially equal to the p-type doping concentration in p-well ring 42C. Accordingly, the net impurity concentration is substantially equal to zero, and hence base resistance tuning ring 48 is substantially neutral. In yet other embodiments, the doping concentration of the implanted n-type impurity is lower than the p-type doping concentration in p-well ring 42C. In which embodiments, the n-type impurity concentration of the implanted n-type impurity may be lower than about $10^{14}/cm^3$. Accordingly, the net impurity concentration in base resistance tuning ring 48 is p-type, and base resistance tuning ring 48 remains to be a p-type region. The net p-type impurity concentration, which equal to the p-type impurity concentration minus the n-type impurity concentration, is lower than the p-type impurity concentrations in portions 42A and 42B of p-well region 42.

In some embodiments, bottom surface 48A of base resistance tuning ring 48 is lower than the bottom surface 42C' of p-well ring 42C. Top surface 48B of base resistance tuning ring 48 may contact bottom surface 22B of isolation ring 22. Accordingly, base resistance tuning ring 48 spaces p-well portion 42A apart fully from p-well portion 42B. In other embodiments, the top surface (illustrated by dashed line 56A) of base resistance tuning ring 48 is lower than the bottom surface 22A of isolation ring 22. In yet other embodiments, the bottom surface (illustrated by dashed line 56A) of base resistance tuning ring 48 is higher than the bottom surface 42C' of p-well ring 42C. In these embodiments, p-well ring 42C becomes thinner due to the n-type implantation.

Figure 9:
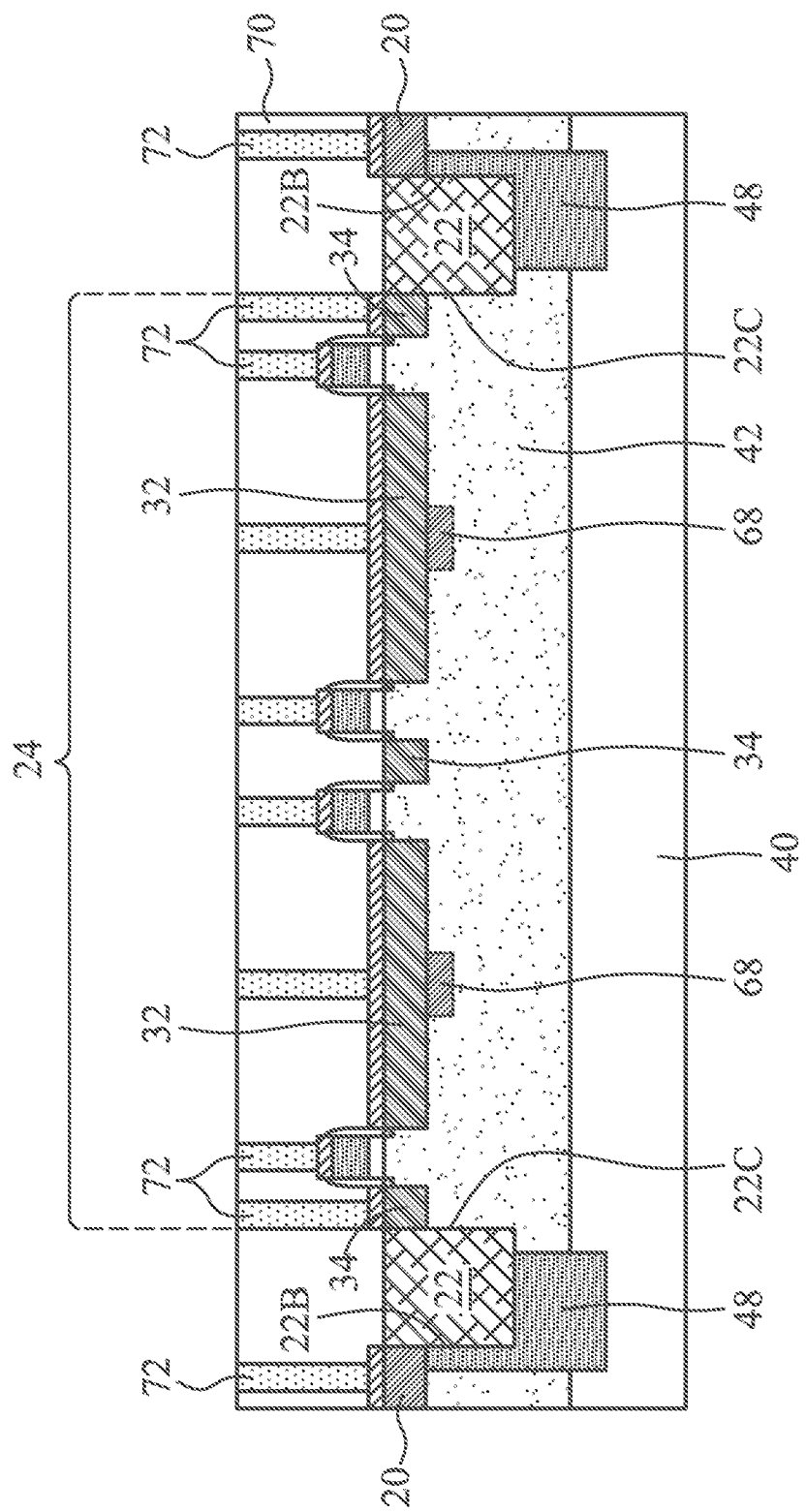

Width W1 of base resistance tuning ring 48 may be between about 100 nm and about 1,000 nm, although width W1 may be greater or smaller. Furthermore, in accordance with some exemplary embodiments, as illustrated in FIG. 4, an entirety of base resistance tuning ring 48 is overlapped by isolation ring 22. In alternative embodiments, as illustrated in FIG. 9, base resistance tuning ring 48 may laterally expand beyond outer edges 22B and/or inner edges 22C of isolation ring 22. For example, FIG. 9 illustrates that base resistance tuning ring 48 laterally expand beyond the outer edges 22B of isolation ring 22, and base resistance tuning ring 48 is overlapped by well pickup regions 20.

Although FIGS. 3 and 4 illustrate that base resistance tuning ring 48 is formed after the formation of p-well region 42, in alternative embodiments, the order for forming base resistance tuning ring 48 and p-well region 42 can be inversed.

Figure 5:
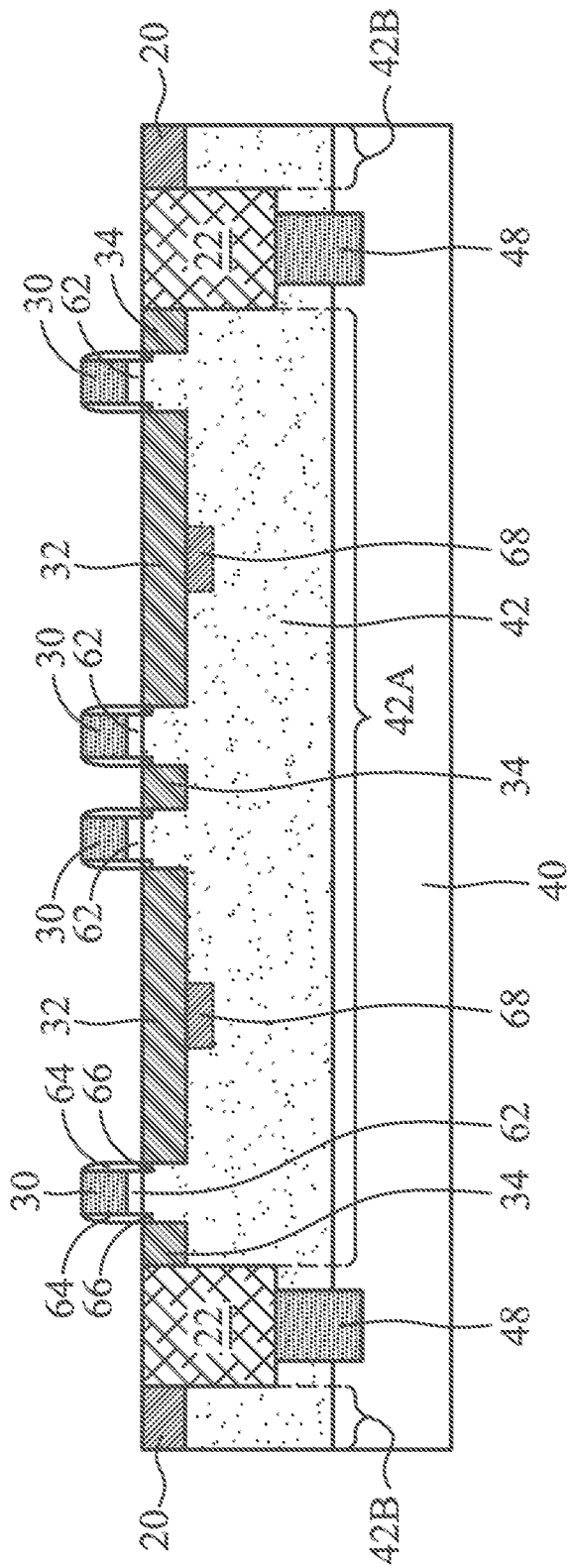

Referring to FIG. 5, a plurality of components of MOS devices 24 is formed, with the respective steps shown as step 108 in FIG. 12. The formed components include gate dielectrics 62 over p-well portion 42A, gate electrodes 30 over gate dielectrics 62, gate spacers 64, drain regions 32, source regions 34, lightly doped source and drain regions 66, and the like. In some exemplary embodiments, gate dielectrics 62 comprise silicon dioxide. Alternatively, gate dielectrics 62 may comprise a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, or combinations thereof. Gate dielectrics 62 may be formed using Chemical Vapor Deposition (CVD), Atomic Layer Deposition (ALD), thermal oxidation, or the like.

Gate electrodes 30 may comprise polycrystalline silicon (polysilicon). Alternatively, gate electrodes 30 comprise a metal or a metal silicide such as Al, Cu, W, Ni, Mo, Co, Ti, Ta, TiN, TaN, NiSi, NiPtSi, CoSi, or combinations thereof. The formation methods of gate electrodes 30 include CVD, Physical Vapor Deposition (PVD), ALD, and other proper processes. The formation of gate dielectrics 62 and gate electrodes 30 may include forming a blanket dielectric layer and a blanket gate electrode layer, and then performing a patterning to form gate dielectrics 62 and gate electrodes 30.

Drain regions 32, source regions 34, and lightly doped source and drain regions 66 may be formed by implanting n-type impurities into p-well portion 42A. Lightly doped source and drain regions 66 may have an n-type impurity concentration between about $10^{14}/cm^3$ and about $10^{15}/cm^3$, for example. Drain regions 32 and source regions 34 may have an n-type impurity concentration between about $10^{19}/cm^3$ and about $10^{21}/cm^3$, for example. The implantation may be formed by forming and patterning photo resists (not shown), and performing implantations.

In addition, p-well pickup regions 20 are formed, for example, by implanting a p-type impurity to surface portions of p-well portions 42B, wherein p-well pickup regions 20 may form a ring in the top view of the structure in FIG. 5 (refer to FIG. 1). P-well pickup region 20 is hence referred to as p-well pickup ring 20 hereinafter. The depths of p-well pickup ring 20 and n-type regions 32, 34, and 66 are smaller than the depth of p-well region 42.

Furthermore, p-type regions 68 may be formed underlying, and connected to, drain regions 32. P-type regions 68 also have their bottom surfaces higher than the bottom surfaces of p-well portion 42A. The top-view sizes of p-type regions 68 may be smaller than the top-view sizes of the respective overlying drain regions 32. Alternatively stating, drain regions 32 may extend laterally beyond the opposite edges (the left and right edges as illustrated) of p-type regions 68. The-type impurity concentration of p-type regions 68 may be between about $10^{19}/cm^3$ and about $10^{21}/cm^3$, for example. In alternative embodiments, p-type regions 68 are not formed. Although not shown, n-type MOS devices may also be formed and encircled by base resistance tuning ring 48.

Figure 6:
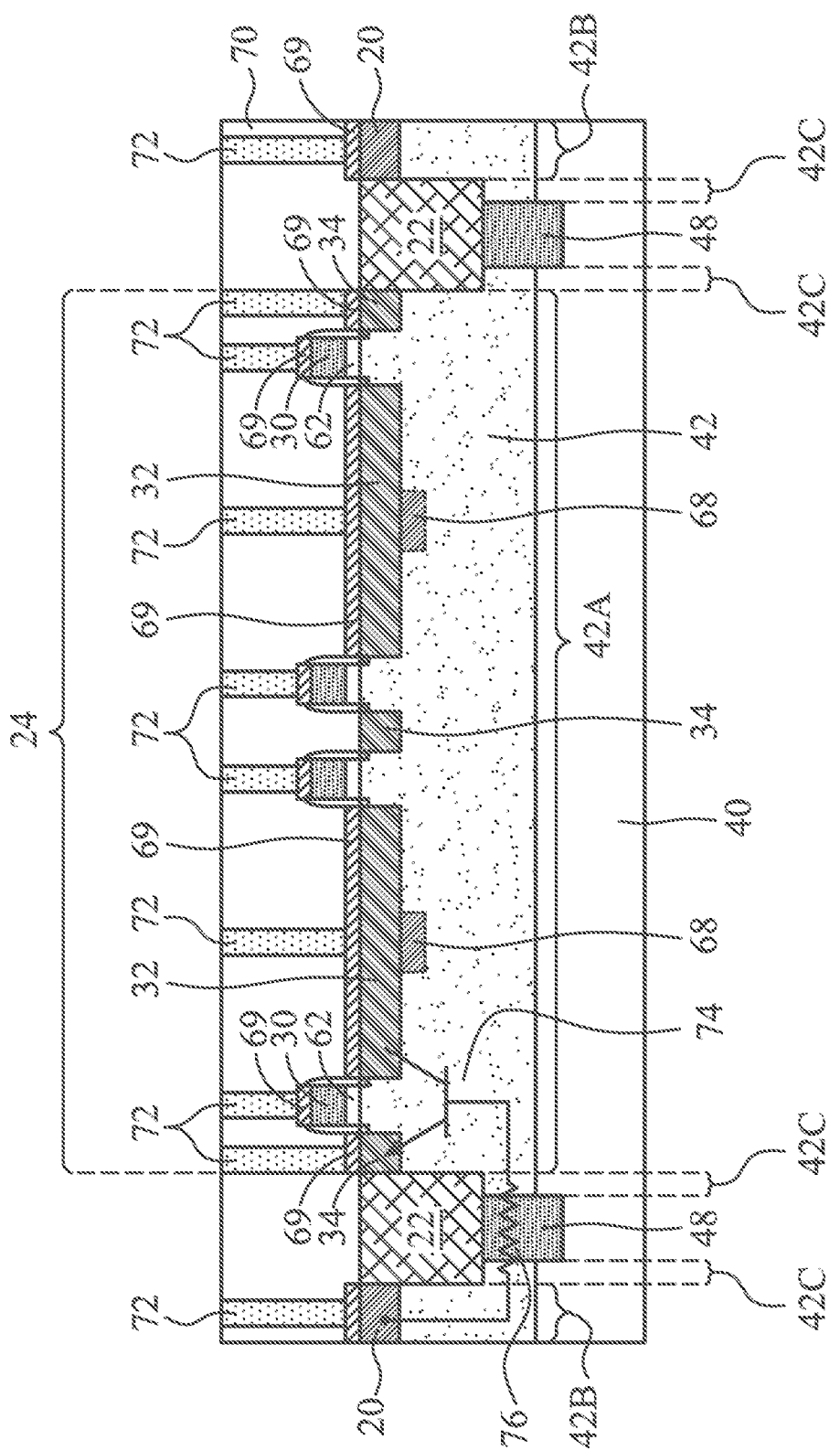

FIG. 6 illustrates the formation of silicide regions 69, which are formed on the top surfaces of p-well pickup ring 20, drain regions 32, source regions 34, and possibly gate electrodes 30. Next, as also shown in FIG. 6, back of line processes (step 110 in FIG. 12) are formed, which includes forming Inter-layer Dielectric (ILD) 70 and contact plugs 72 in ILD 70. Metal layers (not shown) and Inter-Metal Dielectrics (not shown) may then be formed over the structure in FIG. 6.

FIG. 6 schematically illustrates parasitic bipolar transistor 74, which comprises p-well portion 42A as the base, and drain region 32 and source region 34 as the collector and the emitter, respectively. P-well pickup region 20 acts as the base pickup of parasitic bipolar transistor 74. Resistor 76 is illustrated to represent the base resistance of bipolar transistor 74. Due to the formation of base resistance tuning ring 48, the base resistance is increased compared to when no base resistance tuning ring 48 is formed. The increase in the base resistance may be caused by the reduction of the p-type impurity concentration in base resistance tuning ring 48, which causes the resistance of base resistance tuning ring 48 to be increased. In the embodiments wherein base resistance tuning ring 48 is converted to n-type, the increase in the base resistance is caused by the formation of the P-N junctions between p-well region 42 and base resistance tuning ring 48. With the increase in the base resistance, the snapback of MOS device 24 may occur earlier when an ESD transient occurs on drain region 32, and hence MOS device 24 may be turned on earlier to conduct the ESD current from drain region 32 to source region 34. This improves the self-protection of device 24 against ESD transients. The formation of p-type regions 68 may also make the snapback of MOS devices 24 to occur earlier.

FIGS. 7 through 9 and FIGS. 10 and 11 illustrate top views and cross-sectional views of intermediate stages in the formation of integrated circuits structures in accordance with alternative embodiments. Unless specified otherwise, the materials and formation methods of the components in these embodiments are essentially the same as the like components, which are denoted by like reference numerals in the embodiments shown in FIGS. 1 through 6. The details regarding the formation process and the materials of the components shown in FIGS. 7 through 11 may thus be found in the discussion of the embodiments shown in FIGS. 1 through 6.

Figure 7:
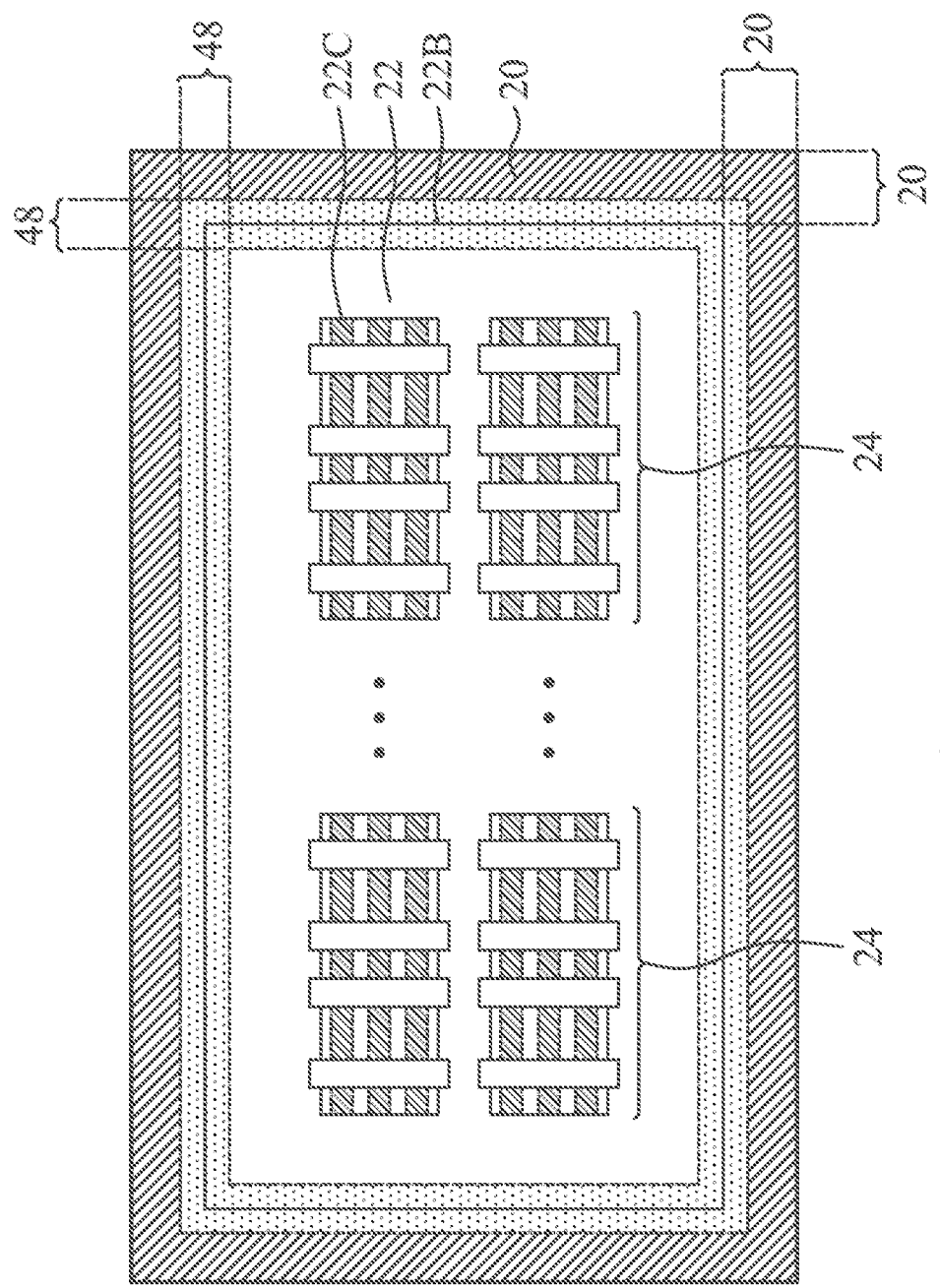
FIG. 7 illustrates a top view of an integrated circuit structure in accordance with alternative embodiments.
Figure 8:
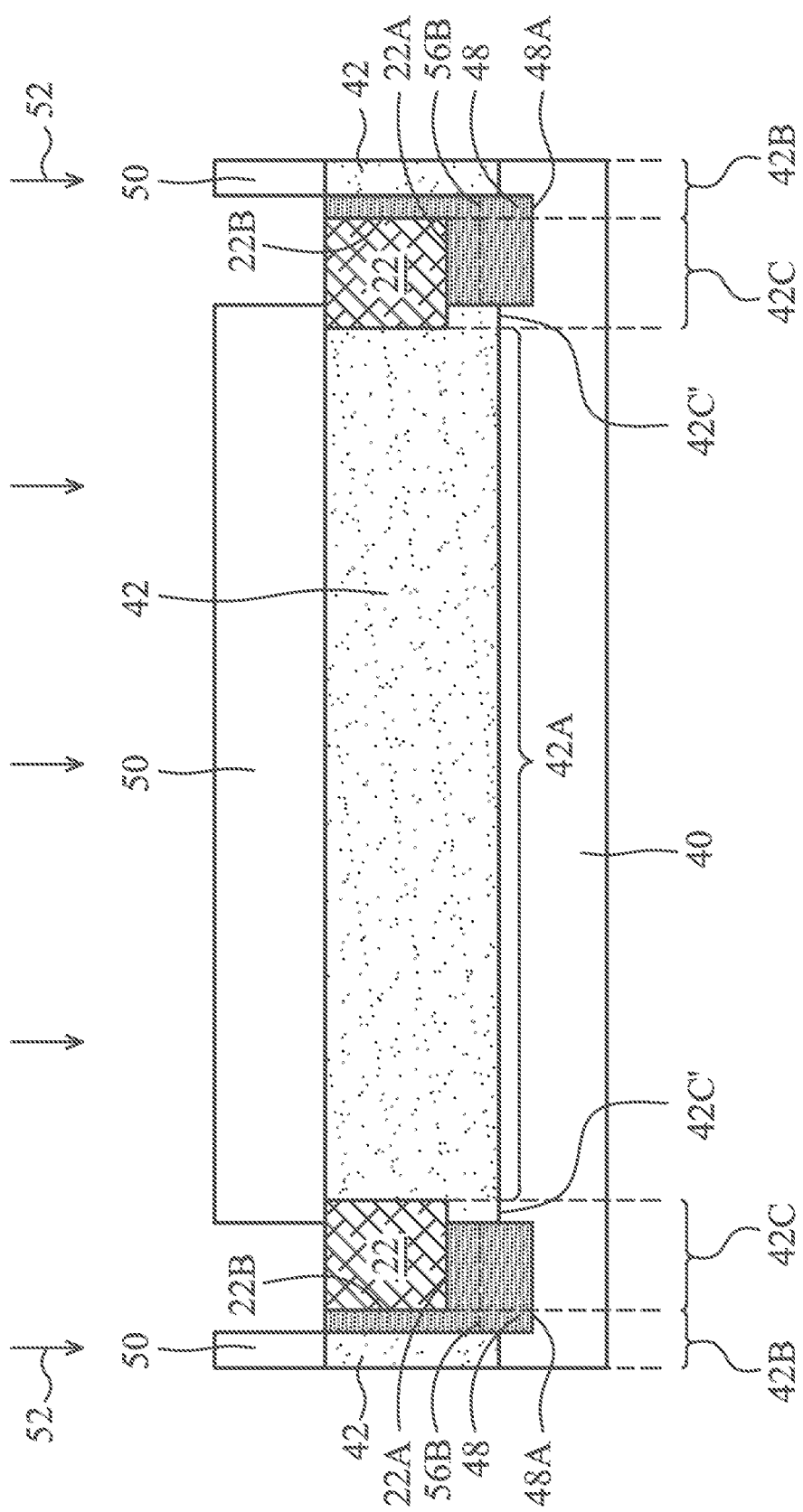
FIGS. 8 and 9 are cross-sectional views of intermediate stages in the manufacturing of the integrated circuit structure in FIG. 7 in accordance with alternative embodiments, wherein a base resistance tuning region extends underlying a well pickup region.

In the embodiments shown in FIGS. 7 through 9, base resistance tuning ring 48 extends beyond the outer edges 22B of isolation regions 22, and portions of base resistance tuning ring 48 are overlapped by p-well pickup ring 20, as shown in FIG. 7. The initial steps of these embodiments are essentially the same as shown in FIGS. 1 through 3. Next, as shown in FIG. 8, base resistance tuning ring 48 is formed through a p-type implantation. The process details are similar to the embodiments in FIG. 4, except that portions of p-well portion 42B are exposed to receive the implanted p-type impurity. In some embodiments, as shown in FIG. 8, the bottom surface of base resistance tuning ring 48 is lower than the bottom surface of p-well ring 42C. In other embodiments, bottom surface 48A of base resistance tuning ring 48 is higher than bottom surface 42C' of p-well ring 42C, and lower than bottom surface 22A of isolation regions 22. Dashed line 56B illustrates the position of the respective bottom surface of base resistance tuning ring 48 in these embodiments. The final structure of MOS device 24 is illustrated in FIG. 9. The formation of the components of MOS device 24 is essentially the same as in the embodiments in FIGS. 5 and 6.

Figure 10:
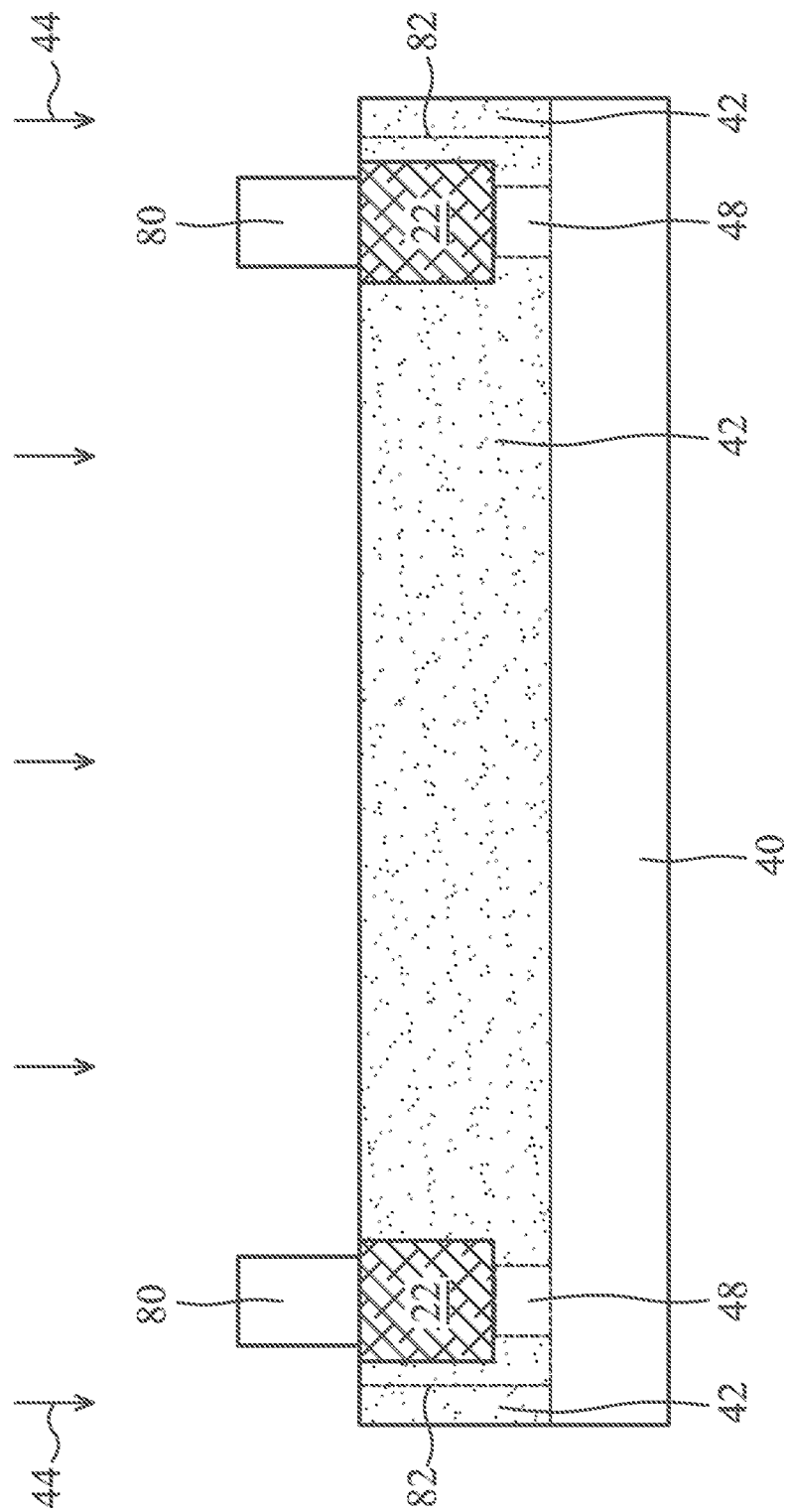
FIGS. 10 and 11 are cross-sectional views of intermediate stages in the manufacturing of the integrated circuit structure in FIG. 1 in accordance with yet alternative embodiments, wherein a portion of a substrate between a well pickup region and the respective well region is not doped during the well implantation.
Figure 11:
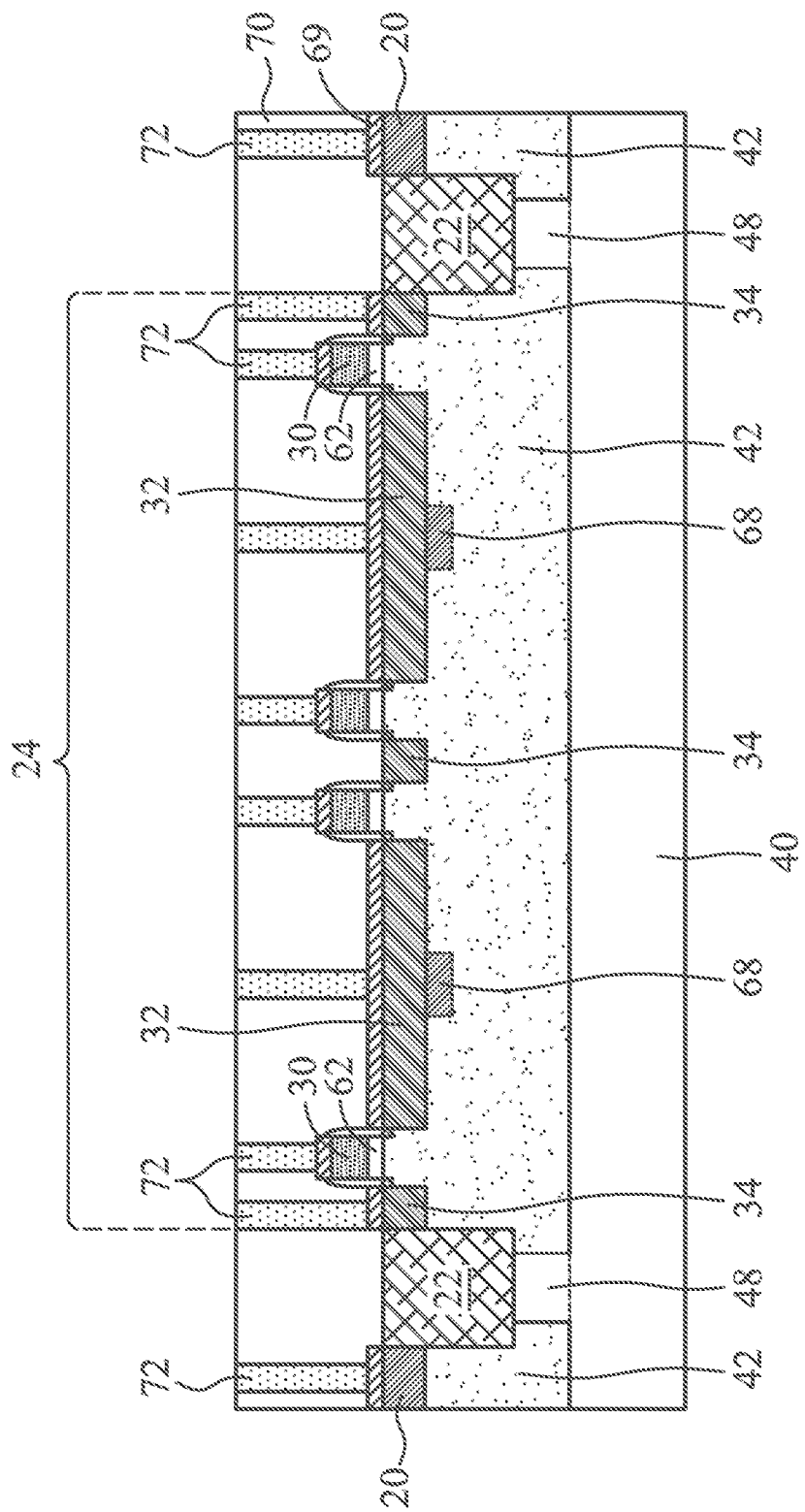

FIGS. 10 and 11 illustrate yet other embodiments. The initial steps of these embodiments are essentially the same as shown in FIGS. 1 through 3, and FIGS. 10 and 11 illustrate subsequent steps. In these embodiments, as illustrated in FIG. 10, base resistance tuning ring 48, instead of being formed by forming a p-well region, and counter-doping a portion of the p-well region to form p-well ring 42C, base resistance tuning ring 48 is formed by modifying the pattern of photo resist 80 that is used for forming p-well region 42, so that a portion of substrate 40 is not doped. The un-doped region of substrate 40, which un-doped region separates portions 42A and 42B from each other, acts as base resistance tuning ring 48. As a result, base resistance tuning ring 48 may have a same impurity type, and a same impurity concentration, as that of substrate 40. The process flow of these embodiments is similar to what is shown in FIG. 12, except that steps 104 and 106 are combined into one step, which is shown in FIG. 10.

In some exemplary embodiments in FIGS. 10 and 11, base resistance tuning ring 48 and substrate 40 may be lightly doped with a p-type impurity. Due to the light doping of p-type impurity in base resistance tuning ring 48, the self-protection ability of the resulting MOS devices 24 against ESD is improved. FIG. 11 illustrates a resulting structure including formed MOS device 24. The top view of the structure in FIG. 11 is essentially the same as in FIG. 1. Although FIGS. 10 and 11 illustrate that an entirety of base resistance tuning ring 48 is overlapped by isolation regions 22, base resistance tuning ring 48 may extend to portions 42B of p-well region 42. Dashed lines 82 schematically illustrate the edges of the resulting base resistance tuning ring 48.

In the illustrative embodiments, p-well regions 42 and p-type pickup regions 20 and the respective base resistance tuning regions 48 are discussed. The teaching provided in the present disclosure, however is readily available for the formation of n-well regions and n-type pickup regions, and the respective base resistance tuning regions between the n-well regions and the n-type pickup regions, with the conductivity types of the respective p-well regions 42 and p-type pickup regions 20 and the respective base resistance tuning regions 48 inverted. The top views and cross-sectional views of the respective embodiments may be similar to FIGS. 1 through 12.

In accordance with embodiments, a structure includes an isolation ring at a top surface of a substrate. A well region of a first conductivity type is in a surface portion of the substrate. The well region includes a first portion having a top portion encircled by the isolation ring, and a second portion having a top portion encircling the isolation ring. A base resistance tuning ring includes a portion overlapped by the isolation ring, wherein the base resistance tuning ring is between the first portion and the second portion of the well region. The base resistance tuning ring is selected from the group consisting essentially of a ring of the first conductivity type, a substantially neutral ring, and a ring of a second conductivity type opposite the first conductivity type.

In accordance with other embodiments, a structure includes a substrate, an isolation ring extending from a top surface of the substrate into the substrate, and a well region of a first conductivity type in a surface portion of the substrate. The well region includes a first portion having a top portion encircled by the isolation ring, and a second portion having a top portion encircling the isolation ring. A base resistance tuning ring is overlapped by the isolation ring, wherein the base resistance tuning ring is between, and in contact with, the first portion and the second portion of the well region. The base resistance tuning ring is selected from the group consisting essentially of a ring of the first conductivity type, a substantially neutral ring, and a ring of a second conductivity type opposite the first conductivity type.

In accordance with yet other embodiments, a method includes forming an isolation ring extending from a top surface of a substrate into the substrate, and performing a first implantation to form a well region in the substrate. The first implantation includes implanting a first impurity of a first conductivity type into the substrate. The well region includes a first portion comprising a top portion encircled by the isolation ring, a second portion comprising a top portion encircling the isolation ring, and a third portion overlapped by the isolation ring and interconnecting the first portion and the second portion. A second implantation is implanted to form a base resistance tuning ring, wherein the base resistance tuning ring includes a first portion in the third portion of the well region. The second implantation includes implanting a second impurity of a second conductivity type opposite the first conductivity type.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
    a substrate;
    an isolation ring extending from a top surface of the substrate into the substrate;
    a well region of a first conductivity type in a surface portion of the substrate, wherein the well region comprises:
        a first portion comprising a top portion encircled by the isolation ring; and
        a second portion comprising a top portion encircling the isolation ring; and
    a base resistance tuning ring comprising a first portion overlapped by the isolation ring, wherein the base resistance tuning ring is between the first portion and the second portion of the well region, and wherein the base resistance tuning ring is selected from the group consisting essentially of:
        a ring of the first conductivity type, with a net impurity concentration of the base resistance tuning ring being lower than a net impurity concentration of the well region;
        a substantially neutral ring; and
        a ring of a second conductivity type opposite the first conductivity type.

2. The integrated circuit structure of claim 1, wherein the base resistance tuning ring is of the first conductivity type.

3. The integrated circuit structure of claim 1, wherein the base resistance tuning ring is a substantially neutral ring.

4. The integrated circuit structure of claim 1, wherein the base resistance tuning ring is of the second conductivity type.

5. The integrated circuit structure of claim 1 further comprising a Metal-Oxide-Semiconductor (MOS) transistor, wherein the MOS transistor comprises source and drain regions of the second conductivity type, and wherein the source and drain regions are in the first portion of the well region.

6. The integrated circuit structure of claim 1, wherein an entirety of the base resistance tuning ring is overlapped by the isolation ring.

7. The integrated circuit structure of claim 1, wherein the base resistance tuning ring further comprises a second portion misaligned with the isolation ring, wherein the second portion of the base resistance tuning ring extends into the second portion of the well region.

8. The integrated circuit structure of claim 1, wherein the base resistance tuning ring has a same impurity concentration as the substrate.

9. An integrated circuit structure comprising:
    a substrate;
    an isolation ring extending from a top surface of the substrate into the substrate;
    a well region of a first conductivity type in a surface portion of the substrate, wherein the well region comprises:
        a first portion comprising a top portion encircled by the isolation ring; and
        a second portion comprising a top portion encircling the isolation ring; and
    a base resistance tuning ring overlapped by the isolation ring, wherein the base resistance tuning ring is between, and in contact with, the first portion and the second portion of the well region, and wherein the base resistance tuning ring is selected from the group consisting essentially of:
        a ring of the first conductivity type and having a net impurity concentration lower than a net impurity concentration of the well region;
        a substantially neutral ring; and
        a ring of a second conductivity type opposite the first conductivity type.

10. The integrated circuit structure of claim 9, wherein the base resistance tuning ring comprises a top surface contacting a bottom surface of the isolation ring.

11. The integrated circuit structure of claim 9, wherein the well region further comprises a third portion overlapped by the isolation ring, and wherein the base resistance tuning ring has a bottom surface below a bottom surface of the third portion of the well region.

12. The integrated circuit structure of claim 9, wherein the base resistance tuning ring is of the first conductivity type.

13. The integrated circuit structure of claim 9, wherein the base resistance tuning ring is of the second conductivity type.

14. The integrated circuit structure of claim 9, wherein the base resistance tuning ring has a top view size smaller than a top view size of the isolation ring.

15. A method comprising:
 forming an isolation ring extending from a top surface of a substrate into the substrate;
 performing a first implantation to form a well region in the substrate, wherein the first implantation comprises implanting a first impurity of a first conductivity type into the substrate, and wherein the well region comprises:
  a first portion comprising a top portion encircled by the isolation ring;
  a second portion comprising a top portion encircling the isolation ring; and
  a third portion overlapped by the isolation ring and interconnecting the first portion and the second portion; and
 performing a second implantation to form a base resistance tuning ring, wherein the base resistance tuning ring comprises a first portion in the third portion of the well region, and wherein the second implantation comprises implanting a second impurity of a second conductivity type opposite the first conductivity type.

16. The method of claim 15, wherein the third portion of the well region receiving the second impurity remains of the first conductivity type after the second implantation.

17. The method of claim 15, wherein the third portion of the well region receiving the second impurity is converted to the second conductivity type after the second implantation.

18. The method of claim 15 further comprising:
 forming a Metal-Oxide-Semiconductor (MOS) transistor, wherein the MOS transistor comprises source and drain regions of the second conductivity type, and wherein the source and drain regions are in the first portion of the well region.

19. The method of claim 15, wherein in the second implantation, a portion of the second portion of the well region receives the second impurity to form a second portion of the base resistance tuning ring.

20. The method of claim 15, wherein an entirety of the base resistance tuning ring is overlapped by the isolation ring.

\* \* \* \* \*